United States Patent [19]

Marcus

[11] 4,375,042

[45] Feb. 22, 1983

[54] TEMPERATURE GRADIENT METHOD OF NONUNIFORMLY POLING A BODY OF POLYMERIC PIEZOELECTRIC MATERIAL AND NOVEL FLEXURE ELEMENTS PRODUCED THEREBY

[75] Inventor: Michael A. Marcus, Fairport, N.Y.

[73] Assignee: Eastman Kodak Company, Rochester, N.Y.

[21] Appl. No.: 209,800

[22] Filed: Nov. 24, 1980

[51] Int. Cl.$^3$ .......................................... H01L 41/22
[52] U.S. Cl. .................................. 310/357; 310/330; 310/800
[58] Field of Search ................ 310/357, 800, 330–332; 361/225, 226, 230, 233

[56] References Cited

U.S. PATENT DOCUMENTS

| | | | |
|---|---|---|---|
| 2,659,829 | 11/1953 | Baerwald | 310/358 X |
| 3,365,633 | 1/1968 | Anderson et al. | 361/233 |
| 3,458,915 | 8/1969 | Miller et al. | 29/25.35 |
| 3,781,955 | 1/1974 | Lavrinenko et al. | 29/25.35 |
| 4,079,437 | 3/1978 | Sheffield | 361/233 |

OTHER PUBLICATIONS

Article by C. P. Germano, "Flexure Mode Piezoelectric Transducers", IEEE Transactions on Audio and Electroacoustics, vol. AU–19, No. 1, Mar. 1971.

Article by H. Sussner and K. Dransfeld, entitled "Importance of the Metal–Polymer Interface for the Piezoelectricity of Polyvinylidene Fluoride", Journal of Polymer Science: Polymer Physics Edition, vol. 16, 529–543, (1978), John Wiley & Sons, Inc.

*Primary Examiner*—William M. Shoop
*Assistant Examiner*—Peter S. Wong
*Attorney, Agent, or Firm*—Thomas H. Close

[57] ABSTRACT

A body of polymeric piezoelectric material is nonuniformly poled by establishing a temperature gradient greater than about 10° C. and less than about 100° C. across the thickness of the body and applying an electric field across the thickness of the body in an amount and for a time sufficient to induce nonuniform polarization in the material, whereby a portion of the body near the surface maintained at a lower temperature receives relatively stronger polarization than a portion near the surface maintained at a higher temperature.

In a preferred embodiment of the invention, after poling in one direction in a temperature gradient to more strongly polarize a portion of the material near one surface, the temperature gradient and the field polarity are reversed, to polarize a portion of the body near the opposite surface in an opposite direction.

Flexure mode elements comprising continuous bodies of polymeric piezoelectric material nonuniformly poled according to the method of the present invention exhibit relatively strong flexure mode response to applied fields. A novel flexure mode element produced by one of the methods of the present invention is characterized by having relatively strong polarization near one surface in a direction pointing into the body of material. Another novel flexure mode element produced by one of the preferred methods of the present invention is characterized by having relatively strong polarization in portions near opposite sides of the body and in opposite directions pointing inward toward the body of the material.

12 Claims, 12 Drawing Figures

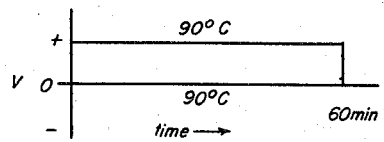 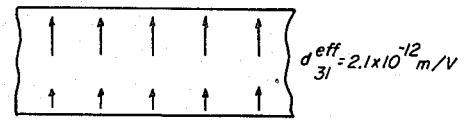
FIG. 3a FIG. 3b
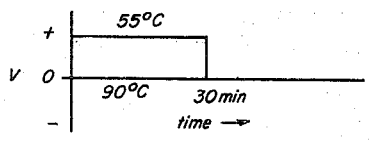 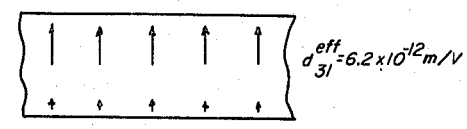
FIG. 4a FIG. 4b
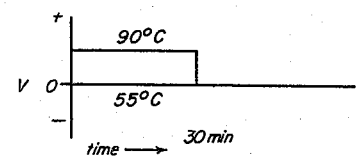 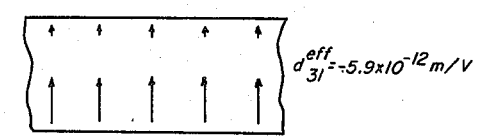
FIG. 5a FIG. 5b
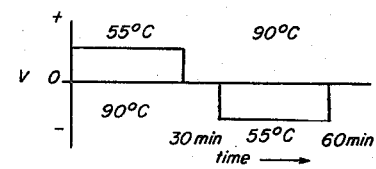 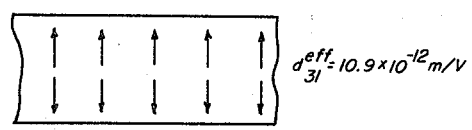
FIG. 6a FIG. 6b
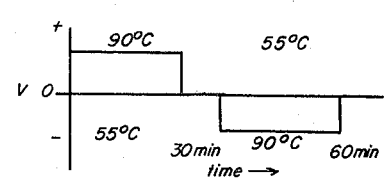 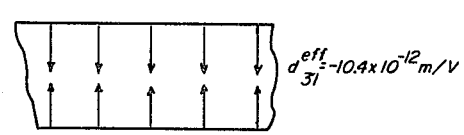
FIG. 7a FIG. 7b

TEMPERATURE GRADIENT METHOD OF NONUNIFORMLY POLING A BODY OF POLYMERIC PIEZOELECTRIC MATERIAL AND NOVEL FLEXURE ELEMENTS PRODUCED THEREBY

BACKGROUND OF THE INVENTION

1. Field of the Invention

The invention relates in general to the poling of a body of polymeric piezoelectric material and more particularly, to the poling of such material to produce nonuniform polarization across the thickness of the body to render the body excitable in a flexure mode.

2. Discussion Related to the Problem

A piezoelectric flexure mode device comprises a plurality of layers of material of differing piezoelectric activity. Under the application of an external field across the thickness of such a device, small expansions and/or contractions in the planes of opposing layers are converted into relatively large deflections of the layers out of their planes. Alternatively, if an external force is applied to the device causing it to flex, a voltage is generated across the layers of the device. Piezoelectric flexure mode devices have found utility both as electrical-to-mechanical and mechanical-to-electrical transducers in such diverse applications as speakers, microphones, phonograph cartridges, motors, and accelerometers. In its simplest form, a piezoelectric flexure device comprises a two layer structure, one of the layers exhibiting piezoelectric activity and the other not. When an electric field is applied across the thickness of the layers, the piezoelectric layer expands or contracts and because the other layer, which is not piezoelectrically active, resists such expansion or contraction, the device flexes or bends. This form of flexure mode device is known as a unimorph. A more common form of flexure mode device, known as a bimorph, comprises two layers of piezoelectric material arranged so that when one expands, the other contracts resulting in approximately twice the deflection for a given applied field. Conventionally, piezoelectric flexure mode devices are manufactured by separately uniformly poling sheets of piezoelectric material, then bonding the sheets together in the described configuration, using an adhesive. This technique has long been employed for making flexure mode devices from piezoelectric ceramic materials such as lead zirconate titanate (PZT). For more information on the structural details of such devices and some of their various uses, one may refer to the article by C. P. Germano entitled "Flexure Mode Piezoelectric Transducers", IEEE Transactions on Audio and Electroacoustics, Vol. AU-19, No. 1, March 1971.

More recently, polymeric piezoelectric materials, such as polyvinylidene fluoride ($PVF_2$), have received considerable attention. As plastics, they are very attractive, since well developed conventional plastic manufacturing technologies may be adapted to their economical manufacture. One of the major problem areas encountered in making polymeric piezoelectric flexure mode devices has been in the bonding of layers to form the devices. Problems with adhesion of the bonding material, and proper matching of the mechanical impedance of the adhesive and the polymeric piezoelectric material have been encountered. One way of overcoming the bonding problem in the manufacture of a piezoelectric ceramic flexure mode device is taught in U.S. Pat. No. 2,659,829 issued Nov. 17, 1953 to H. G. Baerwald. Baerwald discloses the technique of nonuniformly poling a single sheet of piezoelectric material so that it behaves like a unimorph or bimorph. According to the technique, a slab of piezoelectric material is first poled uniformly in one direction, then the poling is relaxed in a portion of the thickness of the slab by propogating a thermal pulse to a limited depth that momentarily raises the temperature of the material above the Curie point. The resulting structure comprises a continuous slab of material having layers of different piezoelectric activity within the continuous slab. It resembles a monomorph, with one layer piezoelectrically active and another layer substantially inactive. In a further embodiment, the slab is then subjected to a poling field of the opposite polarity and of such a strength so as to polarize the unpoled material but not to reverse the polarity of the already poled portion of the material. The result is a device similar to a bimorph, having two layers poled in opposite directions in one continuous slab of material.

If this technique could be applied to polymeric piezoelectric materials to produce a multilayer structure in a continuous body of material, the bonding problems could likewise be resolved. Unfortunately, polymeric piezoelectric materials such as $PVF_2$ do not exhibit a true Curie point below the melting point of the polymer. When the thermal depolarization technique is attempted, all that results is a molten blob of plastic.

Some observers have noted that single films of $PVF_2$, poled under certain conditions of electric field and temperature, exhibit flexure mode behavior attributable to a nonuniform distribution of piezoelectric activity across the thickness of the film (see the article by H. Sussner and K. Dransfeld entitled "Importance of the Metal-Polymer Interface for the Piezoelectricity of Polyvinylidene Fluoride", Journal of Polymer Science: Polymer Physics Edition, Vol. 16, 529–543, (1978), John Whiley & Sons, Inc.). The nonuniformly poled polymeric piezoelectric material produced thereby, although exhibiting some flexure mode behavior, is not nearly as active in flexure mode as the devices produced by bonding multiple layers of differently poled material. It is a purpose of the present invention to provide methods of nonuniformly poling polymeric piezoelectric material, such as $PVF_2$ that increase the flexure mode activity over that observed in the prior art.

SOLUTION OF THE PROBLEM—SUMMARY OF THE INVENTION

According to the present invention, a body of polymeric piezoelectric material is nonuniformly poled by establishing a temperature gradient greater than 10° C. and less than about 100° C., with the lower temperature greater than the glass transition temperature of the material, and the higher temperature less than the melting point of the material, across the thickness of the body and applying an electric field across the thickness of the body in an amount and for a time sufficient to induce nonuniform polarization in the material. As a result, the portion of the body near the surface maintained at the lower temperature is more strongly polarized than the portion of the body near the surface maintained at the higher temperature. The presently preferred range of temperature gradient is about 20° C. to about 60° C., with the lower temperature in the range of from about 25° C. to about 70° C. In a preferred embodiment of the invention, the body of material is first poled in a temperature gradient in one direction, to relatively strongly polarize a portion of the body ner one surface, then the temperature gradient and the field polarity are reversed to polarize a portion of the body near the opposite surface in the opposite direction.

Flexure mode elements comprising continuous bodies of polymeric piezoelectric material nonuniformly poled according to the method of the present invention exhibit relatively strong flexure mode response to applied fields. A novel flexure mode element produced by one method of the present invention is characterized by having relatively strong polarization near one surface thereof, in a direction pointing into the body. Another novel flexure mode element produced by one of the preferred methods of the present invention is characterized by having relatively strong polarization near opposite surfaces of the body and in directions pointing inward to the body.

BRIEF DESCRIPTION OF THE DRAWINGS

The invention will be described with reference to the drawings, wherein:

FIG. 3a illustrates the poling conditions for a comparative example using no temperature gradient;

FIG. 3b is an enlarged schematic partial cross section of a sheet of a polymeric piezoelectric material poled according to the comparative example;

FIGS. 4a–7a illustrate poling conditions for a series of samples of polymeric piezoelectric material poled in temperature gradients according to the methods of the present invention; and FIGS. 4b–7b are enlarged schematic partial cross sections of the samples of piezoelectric polymeric material poled according to the present invention under the conditions shown in FIGS. 4a–7a respectively.

DESCRIPTION OF THE PREFERRED EMBODIMENTS

Poling Apparatus

Figure 1:
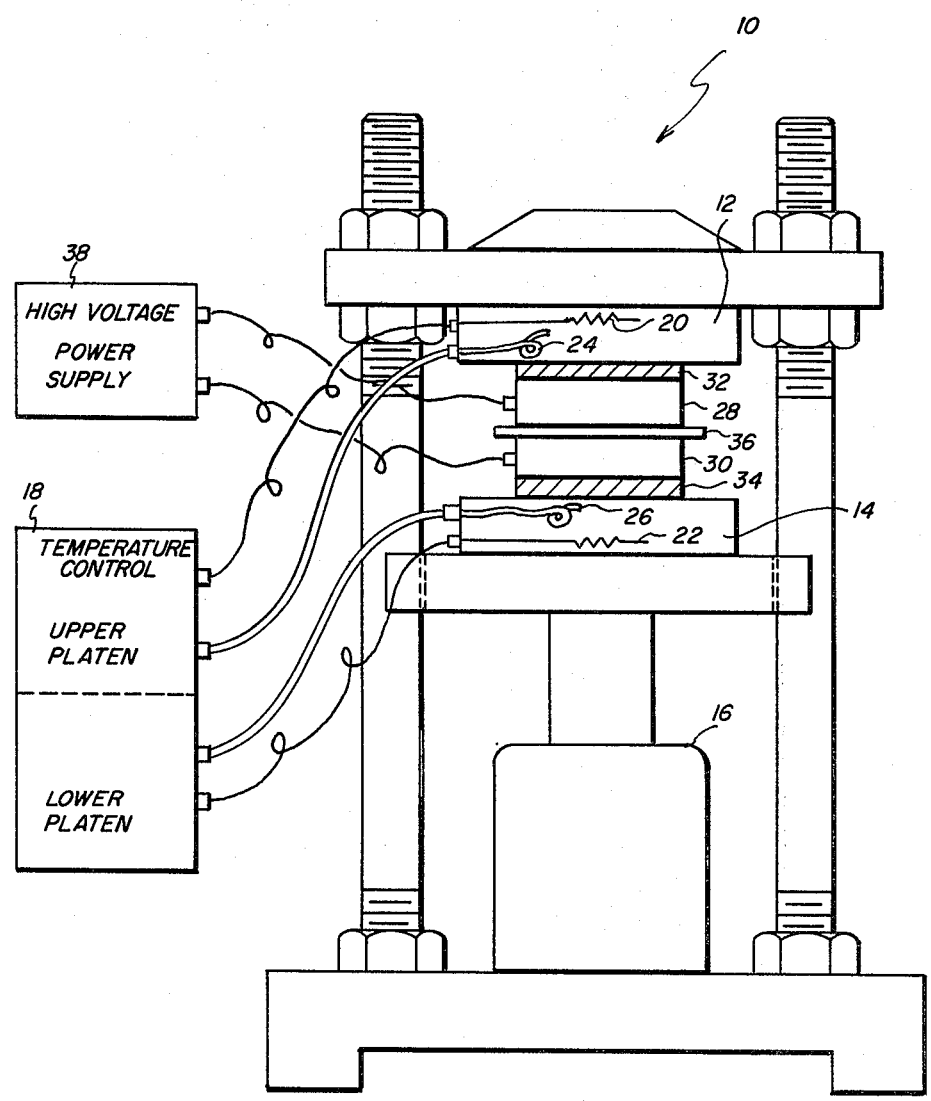
FIG. 1 is a schematic diagram of apparatus employed to pole samples of polymeric piezoelectric material according to the methods of the present invention.

FIG. 1 shows the apparatus employed to pole samples of polymeric piezoelectric material according to the methods of the present invention. The apparatus includes a press, generally designated 10, having an upper platen 12 and a lower platen 14. The lower platen 14 is controllably urged toward upper platen 12 by an hydraulic jack 16. The temperature of the upper and lower platens are independently controllable by a temperature control unit 18. The upper and lower platens are equipped with electrical heating elements 20 and 22 respectively and cooling tubes 24 and 26 respectively for circulating cooling fluid (e.g. chilled water). The temperature control unit 18 maintains the temperature of the respective platens at a desired level in a known manner by supplying controlled amounts of electric current to the heaters and/or cooling fluid to the cooling tubes.

A pair of poling electrodes 28 and 30 comprising $2 \times 2 \times \frac{1}{2}$ inch thick blocks of stainless steel are disposed between the two platens and electrically insulated therefrom by spacer blocks of alumina 32 and 34. The alumina blocks provide good electrical insulation and at the same time are good thermal conductors. A sample of polymeric piezoelectric material 36 is clamped between the electrode blocks 28 and 30. The material contacting surfaces of the electrode blocks are finished to optical flatness to ensure uniform thermal and electrical contact with the material sample. A poling field is established across the electrodes by a high voltage power supply 38.

Flexure Mode Measurements

Figure 2:
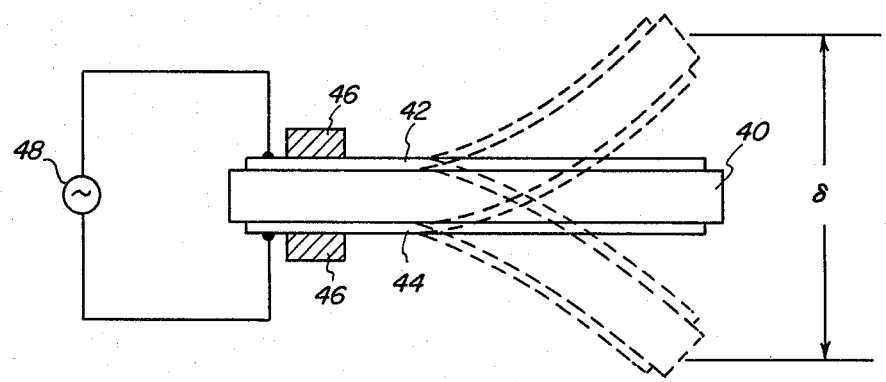
FIG. 2 is a schematic diagram showing the testing procedure employed to evaluate flexure mode activity of samples poled in the apparatus shown in FIG. 1.

Samples of polymeric piezoelectric materials poled in the apparatus described with reference to FIG. 1, are tested in the manner schematically illustrated in FIG. 2 to determine the extent of their flexure mode activity. A rectangular strip 40 of material approximately 3 mm $\times$ 40 mm is cut from the poled piezoelectric material 36 (see FIG. 1). The strip 40 is shown in cross section in FIG. 2. Aluminum electrodes 42 and 44 are deposited on the top and bottom surfaces, respectively, using standard aluminum vapor deposition techniques. One end of the resulting structure is clamped in a fixture 46 to form a cantilever piezoelectric bender element. A voltage of alternating polarity is applied across the piezoelectric material by connecting a 300 volt AC power supply 48 across electrodes 42 and 44, thereby causing the bender to deflect up and down as indicated by dotted lines in FIG. 2. The maximum deflection $\delta$ produced at the tip of the bender is measured to determine the flexure mode activity of the poled sample.

The deflections produced by samples poled under various poling conditions are translated to an effective piezoelectric constant by comparing the deflections actually produced to the predicted deflection of a theoretically perfect bimorph having zero bonding layer thickness.

The theoretical deflection at the free end of such a perfect bimorph is given by:

$$\delta = 3/2 d_{31} V L^2 / t^2 \tag{1}$$

where:

$\delta$ is the deflection;

$d_{31}$ is the piezoelectric constant that defines the strain produced in the plane of the material by an electric field perpendicular to the plane of the material;

V is the applied voltage;

L is the length of the bimorph; and t is the overall thickness.

After a sample is tested according to the procedure described above to determine $\delta$, equation (1) is solved for $d_{31}$ to yield an effective $d_{31}$ ($d_{31}^{eff}$) that can be compared to the $d_{31}^{eff}$ of other samples produced under various poling conditions.

EXAMPLES

In the following examples a series of samples of 90 $\mu$m thick, uniaxially stretched PVF$_2$ film made from "Kynar 961" brand PVF$_2$ purchased from the Pennwalt Corporation were poled in a field of 0.5 MV/cm under various temperature conditions and for various times. After the samples were poled, they were tested for flexure mode activity by the method described above with reference to FIG. 2. A $d_{31}^{eff}$ for each sample was computed from the test results for comparison with the other samples.

Example 1—Comparative Example

To establish a basis for comparison with samples poled according to the method of the present invention, a first sample was poled for sixty minutes in one direction at a uniform temperature of 90° C. FIG. 3a illustrates these poling conditions. The solid line indicates the field polarity of the top poling electrode with respect to the bottom poling electrode, and the temperatures of the top and bottom surfaces of the sample are indicated above and below the time axis, respectively. After poling, the poling field was removed and the sample returned to room temperature. The sample was then prepared and tested for flexure mode activity, yielding a $d_{31}^{eff}$ of $2.1 \times 10^{-12}$ m/V, indicating some nonuniformity in the poled material. FIG. 3b schematically depicts a partial cross section of the material 40 poled according to Example 1. The arrows 50 and 52 are intended to indicate in a qualitative way, the average piezoelectric activity in the top and bottom halves of the sample, respectively. Arrows 50 and 52 are shown pointing the same direction, indicating that the polarity of piezoelectric activity is the same throughout the sample, the difference in the lengths of the arrows indicating the existance of flexure mode activity. For piezoelectric material poled asymmetrically in one direction, any piezoelectric activity in the weaker half of the material will cancel part of the piezoelectric activity contributing to bending in the stronger half of the material.

Example 2—Invention

A second sample, prepared in accordance with the methods of the present invention, was poled for 30 minutes in one direction in a temperature gradient of 35° C. The top poling electrode was maintained at 55° C. and the bottom poling electrode at 90° C. The poling conditions are illustrated in FIG. 4a. The poled sample was tested for flexure mode activity and found to have a $d_{31}^{eff}$ of $6.2 \times 10^{-12}$ m/V, an almost three-fold improvement over the comparative example (Example 1). FIG. 4b schematically depicts the average piezoelectric activity in the top and bottom halves of a portion of the poled sample. As shown in FIG. 4b, the nonuniformity between the top and bottom halves is very pronounced, the strongest activity occuring in the portion of the material maintained at a lower temperature during poling. The activity in the portion maintained at a higher temperature is very small or nonexistent.

Example 3—Invention

A third sample, was prepared in the same manner as Example 2 with the exception that the temperature gradient across the material was in the opposite direction, with the relatively cold side being on the bottom and the relatively hot side, on top as illustrated in FIG. 5a. The poled sample, when tested for flexure mode activity, was found to have a $d_{31}^{eff}$ of $-5.9 \times 10^{-12}$ m/V. The minus sign (−) in $d_{31}^{eff}$ indicates that the sample bent in the opposite direction from the sample in Example 2. FIG. 5b schematically depicts the average piezoelectric activity in the top and bottom halves of a portion of the sample. Again, most of the piezoelectric activity is concentrated in a portion of the material maintained at a lower temperature during poling. This configuration of nonuniformly poled polymeric piezoelectric material, i.e. with the direction of polarization of the more strongly polarized portion of the material being inward, rather than outward, is considered to be a novel structure.

Example 4—Invention

A fourth sample was prepared by first poling in one direction for 30 minutes in a 35° C. temperature gradient (as in Example 2), then reversing the poling field and the temperature gradient and poling for an additional 30 minutes. The temperature gradient and poling field were reversed by removing the sample from the apparatus and turning it over. These poling conditions are depicted in FIG. 6a. The poled sample was tested for flexure mode activity and found to possess a $d_{31}^{eff}$ of $10.9 \times 10^{-12}$ m/V. This is a truly impressive amount of flexure mode activity in a single sheet of nonuniformly poled polymeric piezoelectric material. FIG. 6b depicts the average piezoelectric activity in the top and bottom halves of a portion of the sample.

Example 5—Invention

Finally, a sample was prepared by poling in one direction for 30 minutes in a 35° C. temperature gradient, then reversing the polarity of the field and the temperature gradient and poling for another 30 minutes, similar to Example 4, with the difference that the direction of the temperature gradient and the poling field, respectively, were 180° out of phase with those employed in Example 4. The polint conditions are illustrated in FIG. 7a. The poled sample was tested and found to have a $d_{31}^{eff}$ of $-10.4 \times 10^{-12}$ m/V; the minus sign (−) indicating that the sample bent in the opposite direction from the sample of Example 4. FIG. 7b depicts the average piezoelectric activity in the top and bottom halves of the sample. This configuration of nonuniformly poled polymeric piezoelectric material, i.e. with the polarization directions in both halves of the material pointing inwardly, rather than outwardly, is considered to be novel.

Other experiments were performed with temperature gradients in the range of 20° to 60° C. with lower temperatures in the range of 25° to 70° C. Poling fields between 0.80 and 0.25 MV/cm were employed. In all cases, the portion of the sample maintained at the lower temperature during poling was observed to be the most piezoelectrically active, independent of the direction of the poling field. Subsequent reversal of the poling direction and the temperature gradient invariably yielded an improvement of nearly a factor of two in flexure mode activity.

A plausible mechanistic explanation for the nonuniform poling produced by the temperature gradient poling method of the present invention is based on temperature dependent electrical conductivity in the piezoelectric material. Because of the temperature gradient, the electrical conductivity across the sample is highly nonuniform. When the poling field is applied, the nonuniform conductivity causes the poling field inside the material to be highly nonuniform, concentrating the field in the colder, and hence less conductive, portion of the material. Typically, the conductivity of a polymeric piezoelectric material is temperature dependent only above its glass transition temperature (Tg). Tg for $PVF_2$ is approximately −40° C. According to the theory advanced above, this would imply a lower limit (Tg) on the poling temperature of a polymeric piezoelectric material. Furthermore, a polymeric piezoelectric material generally cannot be effectively poled at or near its melting temperature (Tm), thereby imposing an upper limit on poling temperature. Tm for $PVF_2$ is approximately 160° C. The maximum temperature gradient in which a polymeric piezoelectric material could be poled, is therefore Tm-Tg, with one side of the material at Tm and the other at Tg. In practice however, very large temperature gradients, on the order of 200° C., are difficult and costly to maintain and are not expected to yield significant improvements over more moderate temperature gradients.

It is presently believed that the upper operating limit on temperature gradient for nonuniformly poling a polymeric piezoelectric material according to the present invention is about 100° C.

On the other hand, if the temperature gradient is too small, the mechanism of temperature dependent conductivity in the polymeric piezoelectric material will not produce significant nonuniformity in the poling field within the material. It is presently believed that the lower operating limit on temperature gradient for nonuniformly poling a polymeric piezoelectric material according to the present invention is about 10° C. The presently preferred range of temperature gradients is 20° C. to 60° C. with the lower temperature in the range between 25° C. and 70° C.

The invention has been described with reference to preferred embodiments, however changes and modification may be made within the spirit and scope of the invention. For example, the invention has been described with respect to embodiments employing poling for given times in one direction then reversing the poling field and temperature gradient and poling in an opposite direction for an equal time. Unequal times in opposite directions and different temperature gradients and/or poling fields could likewise be employed according to the methods of the present invention.

The temperature gradient could be maintained during poling by means other than a press with temperature controlled poling electrodes. For example, polymeric piezoelectric material could be poled according to the present invention by depositing thin electrodes on the material prior to poling and then using the deposited electrodes as poling electrodes. The temperature gradient could be maintained by blowing relatively hot air onto one electrode and relatively cold air on the other.

Furthermore, although the invention was described with reference to PVF$_2$, any other known polymer having piezoelectricity may be used, for example, a copolymer of vinylidene fluoride, and a monomer polymerizable with vinylidene fluoride, such as tetrafluoroethylene, vinylidene fluorochloride, trifluoroethylene, vinyl fluoride, chlorotrifluoroethylene, or propylene hexafluoride.

I claim:

1. A method of nonuniformly poling a body of polymeric piezoelectric material, comprising the steps of:
    establishing a temperature gradient of greater than about 10° C. and less than about 100° C., the lower temperature being greater than the glass transition temperature of the material and the higher temperature being less than the melting point of the material, across the thickness of the body from one surface to another to thereby create a colder surface and a warmer surface; and applying an electric field across the thickness of the body in an amount and for a time sufficient to polarize a portion of the body near said colder surface more strongly than a portion of the body near said warmer surface.

2. The invention as claimed in claim 1, wherein said temperature gradient is greater than about 20° C. and less than about 60° C., the lower temperature being in the range between about 25° C. and about 75° C.

3. The invention claimed in claim 1, wherein said polymeric piezoelectric material is PVF$_2$, said temperature gradient is about 35° C., the lower temperature being about 55° C., and said electric field is about 0.5 lV/cm.

4. A method of nonuniformly poling a body of polymeric piezoelectric material, comprising the steps of:
    establishing a temperature gradient of greater than about 10° C. and less than about 100° C., the lower temperature being greater than the glass transition temperature of the material and the higher temperature being less than the melting point of the material, across the thickness of the material; applying an electric field across the thickness of the material from one surface to another surface in an amount and for a time sufficient to nonuniformly polarize the material, the stronger polarization occurring near the colder surface; and reversing the direction of the temperature gradient and the polarity of the applied electric field for a time sufficient to polarize the portion of the material near the cold surface without substantially affecting the previously polarized portion of the material.

5. The invention claimed in claim 4, wherein said temperature gradient is greater than about 20° C. and less than about 60° C., the lower temperature being in the range between about 25° C. and 75° C.

6. The invention claimed in claim 4, wherein said polymeric piezoelectric material is PVF$_2$; said temperature gradient is about 35° C., the lower temperature being about 55° C., said electric field is about 0.5 MV/cm.

7. A body of nonuniformly poled polymeric piezoelectric material produced by the process of establishing a temperature gradient of greater than about 10° C. and less than about 100° C., the lower temperature being greater than the glass transition temperature of the material and the higher temperature being less than the melting point of the material, across the thickness of the material from one surface to another to thereby create a colder surface and a warmer surface; and applying an electric field across the thickness of the material, said nonuniformly poled material being characterized by having a stronger polarization in a portion near said colder surface.

8. A body of nonuniformly poled polymeric piezoelectric material produced by the process of establishing a temperature gradient of greater than 10° C. and less than about 100° C., the lower temperature being greater than the glass transition temperature of the material and the higher temperature being less than the melting point of the material, across the thickness of the material from one surface to another surface; applying an electric field across the thickness of the material; and reversing the polarity of the temperature gradient and the polarity of the applied electric field, said nonuniformly poled material being characterized by being polarized in a first direction in a portion near one surface thereof and being polarized in a direction opposite said first direction in a portion near the opposite surface thereof.

9. The invention claimed in claim 8, wherein said temperature gradient is greater than about 20° C. and less than about 60° C., the lower temperature being in the range between about 25° C. and 75° C.

10. The invention claimed in claim 8, wherein said polymeric piezoelectric material is PVF$_2$; said temperature gradient is about 35° C., the lower temperature being about 55° C.; and said electric field being about 0.5 MV/cm.

11. A flexure element comprising a sheet of nonuniformity poled polymeric piezoelectric material having stronger average polarization in a portion near one surface than in a portion near the opposite surface thereof, and said stronger polarization being in a direction inward from said surface.

12. A flexure element comprising a sheet of nonuniformly poled polymeric piezoelectric material having oppositely directed polarization in portions near opposite surfaces thereof and directed in an inward direction from said surfaces.

* * * * *

UNITED STATES PATENT AND TRADEMARK OFFICE
CERTIFICATE OF CORRECTION

PATENT NO. : 4,375,042

DATED : February 22, 1983

INVENTOR(S) : Michael A. Marcus

It is certified that error appears in the above—identified patent and that said Letters Patent is hereby corrected as shown below:

Column 9, word bridging lines 6 and 7, delete "nonuniformity" and substitute therefor --nonuniformly--.

Signed and Sealed this

Third Day of May 1983

[SEAL]

Attest:

Attesting Officer

GERALD J. MOSSINGHOFF

Commissioner of Patents and Trademarks